United States Patent [19]

Rivaud et al.

[11] Patent Number: 4,948,624
[45] Date of Patent: Aug. 14, 1990

[54] ETCH RESISTANT OXIDE MASK FORMED BY LOW TEMPERATURE AND LOW ENERGY OXYGEN IMPLANTATION

[75] Inventors: Lydia Rivaud, Rochester; Gilbert Hawkins, Pittsford, both of N.Y.

[73] Assignee: Eastman Kodak Company, Rochester, N.Y.

[21] Appl. No.: 336,994

[22] Filed: Apr. 12, 1989

Related U.S. Application Data

[63] Continuation of Ser. No. 191,525, May 9, 1988, abandoned.

[51] Int. Cl.$^5$ .............................................. B05D 3/06
[52] U.S. Cl. ........................................ 427/38; 427/58; 427/259; 427/264; 427/265
[58] Field of Search ................... 427/38, 58, 259, 264, 427/265

[56] References Cited

U.S. PATENT DOCUMENTS 3,622,382  11/1971  Karl ..................................... 148/1.5
4,679,303   7/1987  Chen et al. ............................ 29/571
4,680,854   7/1987  Ho et al. ............................... 29/576

Primary Examiner—Bernard Pianalto
Attorney, Agent, or Firm—Raymond L. Owens

[57] ABSTRACT

A method of forming oxide masks in silicon in which oxygen ions are implanted into the silicon.

1 Claim, 1 Drawing Sheet

ETCH RESISTANT OXIDE MASK FORMED BY LOW TEMPERATURE AND LOW ENERGY OXYGEN IMPLANTATION

CROSS REFERENCE TO RELATED APPLICATION

This is a continuation of the earlier filed application Ser. No. 191,525 filed May 9, 1988 now abandoned.

FIELD OF THE INVENTION

This invention relates to a method for forming an etch resistant oxide mask by implanting oxygen ionized particles into silicon.

BACKGROUND ART

In the fabricating of electronic devices, the formation of silicon oxide layers to form masks resistant to chemical etches designed for the substrate is known in the art.

Silicon oxide layers have been formed by high temperature thermal oxidation as illustrated in FIG. 1. A device 10 includes silicon substrate 12, a layer 14 of silicon dioxide, which can be grown or deposited by some well-known technique, such as plasma enhanced chemical vapor deposition (CVD). A polysilicon layer 16 can be formed on layer 14 by CVD. Layer 18 is formed of an oxidation mask material, such as a deposited silicon nitride layer. Oxide layer 20 is then deposited on the layer 18. By means of a photolithographic process, portions of the layers 18 and 20 are removed to define an opening, oxygen gas in a high temperature system (e.g. 900° C.) oxidizes the exposed polysilicon 16 to form an oxide mask 22. The oxide mask 22 is self-aligned to the original opening in the pattern defining layers 18 and 20. This feature of self-alignment is often quite advantageous because mask to mask alignment tolerances are increased. However, the process as commonly implemented suffers from several disadvantages. First, a high temperature step (e.g. 900° C. or greater) is required for thermal oxidation and is undesirable in device formation. Second, the grown oxide mask expands laterally so that self-alignment is not precisely achieved. This results in the formation of a "bird's beak", which is shown as number 24. Third, the materal on which the oxide mask is grown is subjected to mechanical stress particularly near the bird's beak regions.

More specifically, the bird's beak is formed during the thermal oxidation of a silicon substrate owing to lateral diffusion of the oxidant species. The term silicon in this specification and claims includes polysilicon. The bird's beak decreases lateral resolution of the device being fabricated.

SUMMARY OF THE INVENTION

The object of this invention is the elimination of the "bird'beak" in oxide layers.

This object is achieved by implanting oxygen ions into silicon at low temperature and low energy to provide a sharply defined oxide mask.

Quite unexpectedly, it has been found that oxygen ions can be implanted to effectively form etch resistant masks without a high temperature heat treatment.

Figure 1:
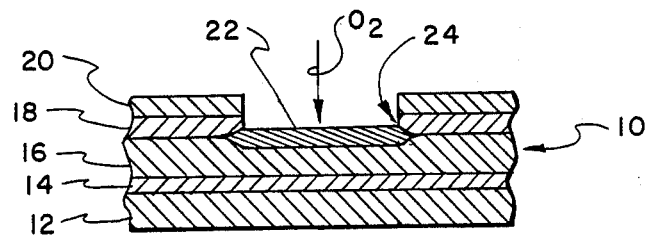
FIG. 1 is a side view of a portion of a device illustrating a prior art process for thermally growing an oxide mask.

It should be appreciated that for purposes of exposition, the drawings are not to scale since the various dimensions particularly in the vertical direction of the drawing are quite small.

MODE OF CARRYING OUT THE INVENTION

Ion implantation is a well-known method utilized in semiconductor and other fabrication processes. In general, charged particles are utilized to introduce atoms or molecules into a substrate material. The substrate is typically a semiconductor wafer formed of silicon or other material common in semiconductor processing. The materials to be injected by ion implantation are typical dopants such as boron or phosphorus. The dopants add impurities to the substrate. The dopant to be implanted into the substrate is charged and accelerated towards the semiconductor by a high-voltage. The ion distribution on the surface of the substrate is generally uniform. The density and the depth of the implanted ions is a function of the acceleration voltage and the ion dose.

In accordance with the invention it has been determined that low temperature and low energy ion implantation of oxygen ions in a silicon can be effectively used to form an oxide mask with sharp edges.

Figure 2:
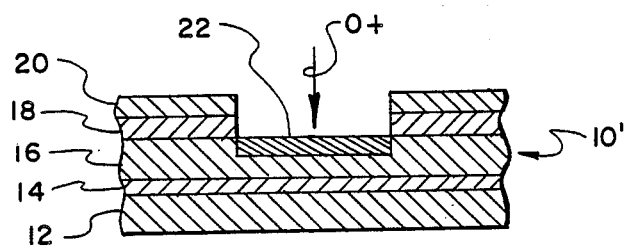
FIGS. 2 and 3 illustrate a process in accordance with the invention.
Figure 3:
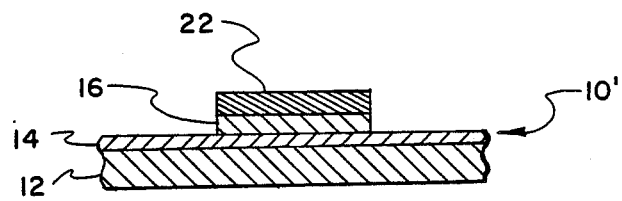

In FIGS. 2 and 3, since the layers are the same as FIG. 1, the same numbers will be used.

Turning to FIG. 2, after photoresist (not shown) has been formed on the oxide layer 20, of a device 10' a wet or plasma etch is used to expose the polysilicon layer 16. The result is that selective regions of the layer 18 and the overlying oxide layer 20 have been removed exposing the surface of the polysilicon. Next oxygen gas ($O_2$) is ionized to form ions ($O+$) which are under a high electric field implanted into the polysilicon layer 16 to form an oxide mask.

Transmission electron microscopy (TEM) of an oxygen implanted sample, made as discussed in the Example below, showed that the polysilicon in the opening of the window was oxidized by the implanted oxygen ions at room temperature (about 25° C.) to a depth corresponding to the range of 30 keV oxygen ions in silicon. The edge of the oxide layer was devoid of a bird's beak and its shape was defined by the LTO mask.

As shown in FIG. 3, the structure formed was then subjected to a polysilicon etch which attacks silicon nitride and polysilicon. It was found that the oxgyen implanted layer did define a polysilicon edge. The oxygen implanted layer was found to be effective as a lithographically formed mask.

In accordance with this invention, it has been determined that the oxide mask can be formed at low temperatures, which for the purpose of this disclosure means below 600° C., preferably at room temperature 20°-30° C. When the temperature is below 600° C there will be little or no diffusion and sharp edges will result. It is also important to implant at low energy to have a surface oxide layer or mask. Low energy will be defined within the range of between 0.1 and 35 keV. As a result of being within these two ranges, an oxide mask (surface layer) will be formed which has sharp edges.

EXAMPLE

3000 Å of polysilicon was deposited on oxidized silicon wafers. Also with some wafers, a layer of $WSi_2$ was deposited. An optional protective layer 500 Å thick of $Si_3N_4$ was deposited over the polysilicon. As oxygen implant masking low temperature oxide layer consisting of low temperature oxide 1 μm thick was next deposited at 400° C. and the last two layers lithographically patterned and etched as shown in FIG. 2 to define 2 μm openings. Oxygen ions of energies 10 to 35 keV were implanted at doses of from $1 \times 10^{15}$ to $5 \times 10^{16}$ cm$^{-2}$ at about 25° C. into the sample. The low temperature oxide and optional silicon nitride or $WSi_2$ protective layers were removed by etching, thereby exposing the polysilicon layer in which oxygen ions had been selectively implanted into the near surface region. These wafers were then subjected to anisotropic reactive ion etching in a chlorine ambient. Polysilicon was removed in those regions in which the oxygen implant masking layer of low temperature oxide was present. As shown in FIG. 3, a two micron line of polysilicon remained in the region under the implant masking layer after the low temperature oxide had been removed.

The invention has been described in detail with particular reference to preferred embodiments thereof, but it will be understood that variations and modifications can be effected within the spirit and scope of the invention

We claim:

1. A method of forming an etch resistant oxide mask in polysilicon comprising the steps of:
   (a) forming an oxide gate layer on a silicon substrate;
   (b) depositing a conductive etchable polysilicon layer on the oxide gate layer;
   (c) chemically depositing an oxygen masking layer and patterning it with openings; and
   (d) selectively implanting oxygen ions with energies in a range between 0.1 and 35 keV through the opening into the polysilicon and at a temperature below 600° C. selected so that an oxide mask is formed on the surface of the polysilicon.

* * * * *